United States Patent
Carey et al.

(10) Patent No.: US 8,852,963 B2
(45) Date of Patent: Oct. 7, 2014

(54) METHOD FOR MAKING A CURRENT-PERPENDICULAR-TO-THE-PLANE (CPP) MAGNETORESISTIVE SENSOR HAVING A LOW-COERCIVITY REFERENCE LAYER

(71) Applicant: HGST Netherlands B.V., Amsterdam (NL)

(72) Inventors: Matthew J. Carey, San Jose, CA (US); Shekar B. Chandrashekariaih, San Jose, CA (US); Jeffrey R. Childress, San Jose, CA (US); Young-suk Choi, Los Gatos, CA (US); John Creighton Read, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 66 days.

(21) Appl. No.: 13/765,290

(22) Filed: Feb. 12, 2013

(65) Prior Publication Data
US 2014/0227803 A1   Aug. 14, 2014

(51) Int. Cl.
*H01L 21/00* (2006.01)
*H01L 43/12* (2006.01)

(52) U.S. Cl.
CPC .................................... *H01L 43/12* (2013.01)
USPC .......... 438/3; 438/48; 257/414; 257/E43.004; 257/E43.006

(58) Field of Classification Search
CPC ............... G11B 5/3903; G11B 5/3967; G11B 2005/3996; G11B 5/3163; G11B 5/313; G11B 5/3103; H01L 43/08; H01L 43/12

USPC .......... 257/E43.004, E43.006, 414; 365/158, 365/8; 438/3, 48
See application file for complete search history.

(56) References Cited

U.S. PATENT DOCUMENTS

| | | | |
|---|---|---|---|
| 6,215,631 B1 * | 4/2001 | Fujikata et al. .......... 360/324.11 |
| 6,541,131 B1 | 4/2003 | Ristau | |
| 6,998,061 B1 | 2/2006 | Cross | |
| 7,035,061 B2 | 4/2006 | Singleton | |
| 7,270,896 B2 | 9/2007 | Parkin | |
| 7,663,845 B2 | 2/2010 | Hirata et al. | |
| 7,820,455 B2 * | 10/2010 | Gill et al. .......................... 438/3 |

(Continued)

OTHER PUBLICATIONS

You, et al., "Exchange bias of spin valve structure with a top-pinned C040Fe40B20IrMn", Applied Physics Letter, 93, 012501 (2008); doi: 10.1063/1.2956680.

(Continued)

*Primary Examiner* — Bac Au
(74) *Attorney, Agent, or Firm* — Thomas R. Berthold

(57) ABSTRACT

A method for making a current-perpendicular-to-the-plane (CPP) magnetoresistive (MR) sensor that has a reference layer with low coercivity includes first depositing, within a vacuum chamber, a seed layer and an antiferromagnetic layer on a substrate without the application of heat. The substrate with deposited layers is then heated to between 200-600° C. for between 1 to 120 minutes. The substrate with deposited layers is then cooled, preferably to room temperature (i.e., below 50° C., but to at least below 100° C., in the vacuum chamber. After cooling of the antiferromagnetic layer, the ferromagnetic reference layer is deposited on the antiferromagnetic layer. Then the substrate with deposited layers is removed from the vacuum chamber and subjected to a second annealing, in the presence of a magnetic field, by heating to a temperature between 200-400° C. for between 0.5-50 hours.

17 Claims, 5 Drawing Sheets

(56) References Cited

U.S. PATENT DOCUMENTS

| | | |
|---|---|---|
| 8,048,492 B2 | 11/2011 | Fukuzawa et al. |
| 8,617,644 B2 * | 12/2013 | Carey et al. .................... 427/130 |
| 2004/0165321 A1 * | 8/2004 | Hasegawa et al. ....... 360/324.11 |
| 2005/0122636 A1 * | 6/2005 | Carey et al. .............. 360/324.11 |
| 2005/0174701 A1 * | 8/2005 | Kasiraj et al. .............. 360/324.2 |
| 2008/0026253 A1 * | 1/2008 | Yuasa et al. ................... 428/811 |
| 2011/0089940 A1 * | 4/2011 | Carey et al. ................... 324/252 |
| 2013/0244192 A1 * | 9/2013 | He et al. ............................ 432/9 |

OTHER PUBLICATIONS

Imakita et al., "Giant exchange anisotropy observed in Mn—IrCo—Fe bilayers containing ordered Mn3IR phase", Applied Physics Letters, 85, 3812 (2004); doi:10.106311.1812597.

* cited by examiner

METHOD FOR MAKING A CURRENT-PERPENDICULAR-TO-THE-PLANE (CPP) MAGNETORESISTIVE SENSOR HAVING A LOW-COERCIVITY REFERENCE LAYER

BACKGROUND OF THE INVENTION

1. Field of the Invention

The invention relates generally to a current-perpendicular-to-the-plane (CPP) magnetoresistive sensor that operates with the sense current directed perpendicularly to the planes of the layers making up the sensor stack, and more particularly to an improved method for forming the reference layer of the CPP sensor.

2. Background of the Invention

One type of conventional magnetoresistive (MR) sensor used as the read head in magnetic recording disk drives is a "spin-valve" sensor based on the giant magnetoresistance (GMR) effect. A GMR spin-valve sensor has a stack of layers that includes two ferromagnetic layers separated by a nonmagnetic electrically conductive spacer layer, which is typically formed of Cu or Ag. One ferromagnetic layer, typically called the "reference" layer, has its magnetization direction fixed, such as by being pinned by exchange coupling with an adjacent antiferromagnetic "pinning" layer, and the other ferromagnetic layer, typically called the "free" layer, has its magnetization direction free to rotate in the presence of an external magnetic field. With a sense current applied to the sensor, the rotation of the free-layer magnetization relative to the fixed-layer magnetization is detectable as a change in electrical resistance. If the sense current is directed perpendicularly through the planes of the layers in the sensor stack, the sensor is referred to as current-perpendicular-to-the-plane (CPP) sensor.

In a magnetic recording disk drive CPP-GMR read sensor or head, the magnetization of the fixed or pinned reference layer is generally perpendicular to the plane of the disk, and the magnetization of the free layer is generally parallel to the plane of the disk in the absence of an external magnetic field. When exposed to an external magnetic field from the recorded data on the disk, the free-layer magnetization will rotate, causing a change in electrical resistance.

The reference layer in a CPP-GMR sensor used in read heads may be a single pinned layer (sometimes called a "simple" pinned layer), in contrast to the well-known antiparallel (AP) pinned structure. In a simple pinned structure the reference layer has its magnetization pinned by being exchange-coupled to an antiferromagnetic (AF) pinning layer, which is typically a Mn alloy like IrMn. However, CPP-GMR sensors are hampered by reference layer instability. The signal to noise ratio (SNR) of CPP-GMR sensors is limited by spin-torque generated fluctuations of the magnetizations of the free and reference layers. The free layer can be made more stable to such spin-torque instability by forming an antiferromagnetically coupled (AFC) ferromagnet/Ru/ferromagnet trilayer, also called an antiparallel (AP) free layer. In contrast, forming such a structure for the reference layer actually increases fluctuations due to spin-torque since the AP-reference layer generally possesses lower magnetic damping compared to a simple-pinned reference layer. Thus the ideal combination for highest SNR in CPP-GMR sensors, all other factors being equal, is an AP-free layer and a simple-pinned reference layer. The simple-pinned reference layer structure is a film stack of seed layers/IrMn AF layer/ferromagnetic reference layer. An ideal reference layer is not only well-coupled to the AF layer, but also has a small coercivity so that only one orientation of the reference layer magnetization exists at low magnetic fields where the sensor will operate. However, the prior art processes for forming the simple-pinned reference layer structure are not only time-consuming but also do not produce a reference layer with the desired low coercivity.

What is needed is an improved method for making a CPP-GMR sensor with a simple-pinned reference layer that is well-coupled to the AF layer and that has low coercivity.

SUMMARY OF THE INVENTION

The invention relates to a method for making a current-perpendicular-to-the-plane (CPP) magnetoresistive (MR) sensor that has a reference layer with low coercivity. Within a vacuum chamber a seed layer is deposited on a substrate without the application of heat to the substrate. This is followed by deposition of an antiferromagnetic layer on the seed layer, also without the application of heat to the substrate. The substrate with deposited layers is then subjected to a first annealing within the vacuum chamber by heating to between 200-600° C. for between 1 to 120 minutes. The first annealing may be performed in the same vacuum chamber but is preferably moved to an interconnected smaller second chamber without breaking vacuum. This allows for better control of the annealing temperature. The substrate with deposited layers is then cooled, preferably to room temperature (i.e., below 50° C., but to at least below 100° C., in the vacuum chamber. After cooling of the antiferromagnetic layer, the ferromagnetic reference layer is deposited on the antiferromagnetic layer. Then the substrate with deposited layers is removed from the vacuum chamber and subjected to a second annealing, in the presence of a magnetic field, by heating to a temperature between 200-400° C. for between 0.5-50 hours.

For a fuller understanding of the nature and advantages of the present invention, reference should be made to the following detailed description taken together with the accompanying figures.

DETAILED DESCRIPTION OF THE INVENTION

Figure 1:
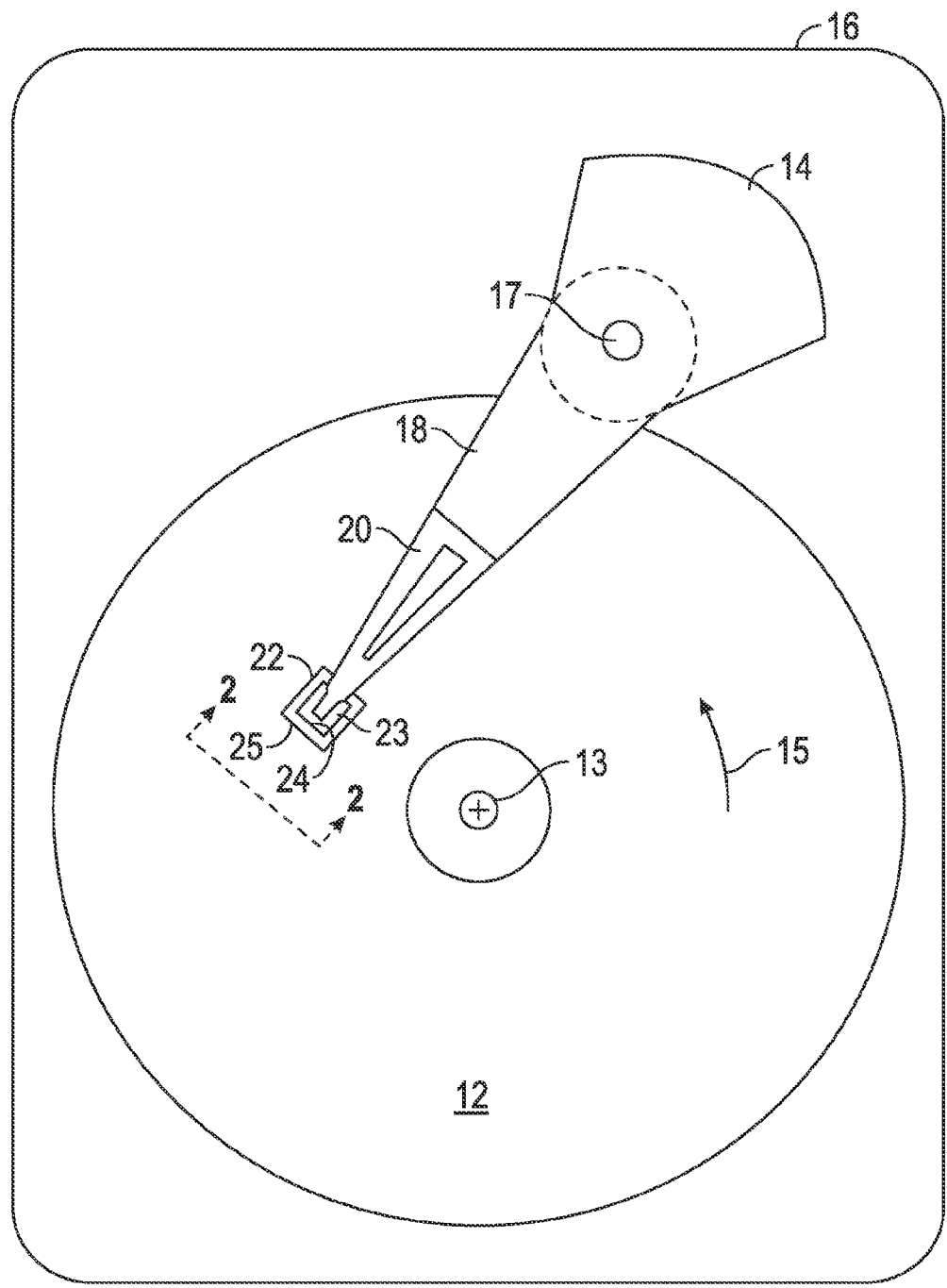
FIG. 1 is a schematic top view of a conventional magnetic recording hard disk drive with the cover removed.

The CPP magnetoresistive (MR) sensor made according to this invention has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
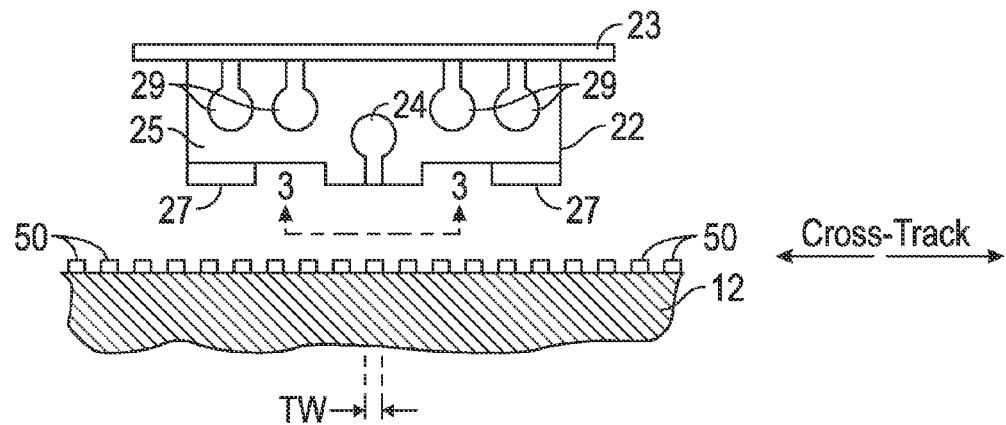
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the trailing surface 25 and is connected to the disk drive read/write electronics by electrical connection to terminal pads 29 on the trailing surface 25. As shown in the sectional view of FIG. 2, the disk 12 is a patterned-media disk with discrete data tracks 50 spaced-apart in the cross-track direction, one of which is shown as being aligned with read/write head 24. The discrete data tracks 50 have a track width TW in the cross-track direction and may be formed of continuous magnetizable material in the circumferential direction, in which case the patterned-media disk 12 is referred to as a discrete-track-media (DTM) disk. Alternatively, the data tracks 50 may contain discrete data islands spaced-apart along the tracks, in which case the patterned-media disk 12 is referred to as a bit-patterned-media (BPM) disk. The disk 12 may also be a conventional continuous-media (CM) disk wherein the recording layer is not patterned, but is a continuous layer of recording material. In a CM disk the concentric data tracks with track width TW are created when the write head writes on the continuous recording layer.

Figure 3:
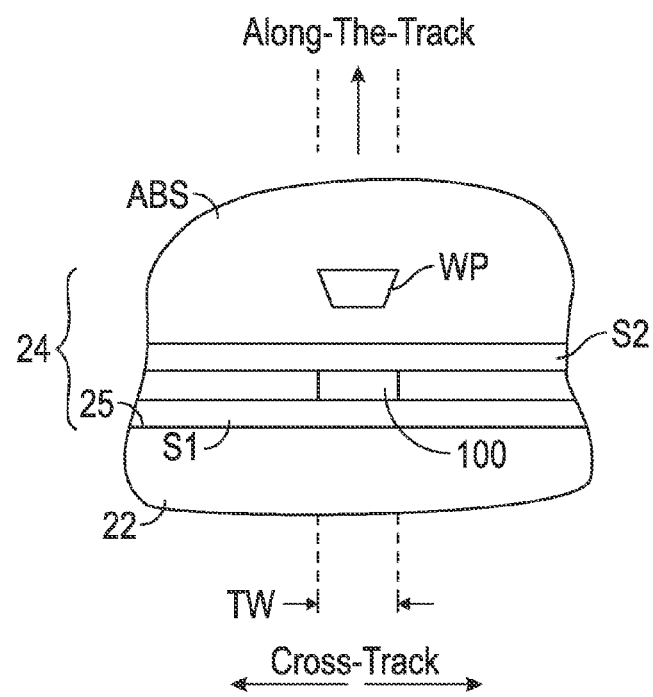
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes a perpendicular magnetic write pole (WP) and may also include trailing and/or side shields (not shown). The CPP MR sensor or read head 100 is located between two magnetic shields S1 and S2. The shields S1, S2 are formed of magnetically permeable material and are electrically conductive so they can function as the electrical leads to the read head 100. The shields function to shield the read head 100 from recorded data bits that are neighboring the data bit being read. Separate electrical leads may also be used, in which case the read head 100 is formed in contact with layers of electrically conducting lead material, such as tantalum, gold, or copper, that are in contact with the shields S1, S2. FIG. 3 is not to scale because of the difficulty in showing very small dimensions. Typically each shield S1, S2 is several microns thick in the along-the-track direction, as compared to the total thickness of the read head 100 in the along-the-track direction, which may be in the range of 20 to 40 nm.

Figure 4:
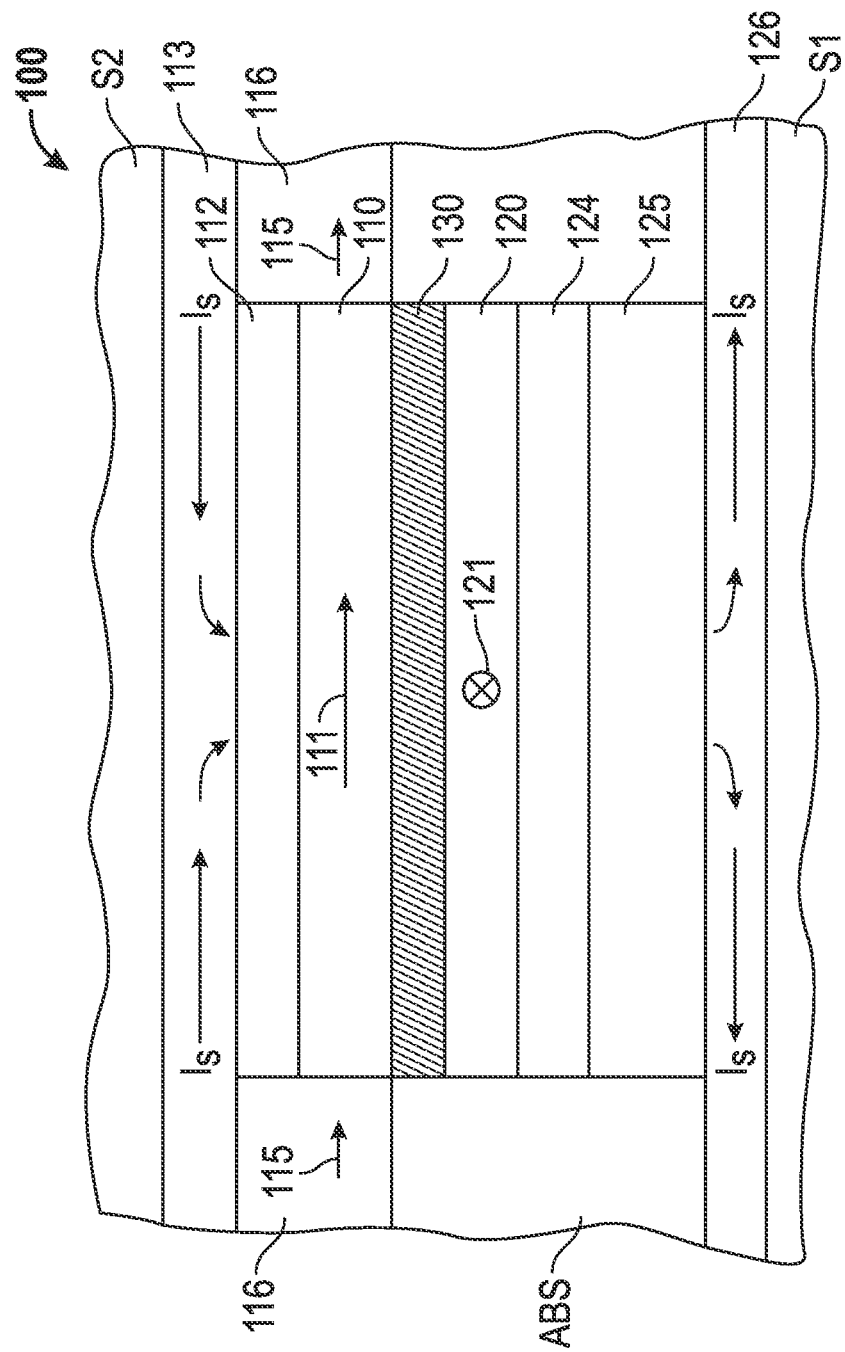
FIG. 4 is a cross-sectional schematic view of a prior art CPP-GMR read head having a simple-pinned reference layer.

FIG. 4 is an enlarged sectional view showing the layers making up sensor 100 as would be viewed from the disk. Sensor 100 is a CPP-GMR read head comprising a stack of layers formed between the two magnetic shield layers S1, S2 that are typically electroplated NiFe alloy films. The shields S1, S2 are formed of electrically conductive material and thus may also function as electrical leads for the sense current $I_S$, which is directed generally perpendicularly through the layers in the sensor stack. Alternatively, separate electrical lead layers may be formed between the shields S1, S2 and the sensor stack. The lower shield S1 is typically polished by chemical-mechanical polishing (CMP) to provide a smooth substrate for the growth of the sensor stack. This may leave an oxide coating which can be removed with a mild etch just prior to sensor deposition. The sensor layers include a simple-pinned ferromagnetic reference layer 120, a free ferromagnetic layer 110, and an electrically conductive nonmagnetic spacer layer 130, typically a metal or metal alloy like Cu, Au, Ag or their alloys, between the reference layer 120 and the free layer 110. A capping layer 112 is located between free layer 110 and the upper shield layer S2. The capping layer 112 provides corrosion protection during processing and magnetically separates the free layer from S2 and may be a single layer or multiple layers of different conductive materials, such as Ru, Ta, NiFe or Cu.

The free layer 110 has its magnetization direction 111 oriented generally parallel to the ABS in the absence of an applied magnetic field. The magnetization direction 111 of free layer 110 is typically biased by a hard magnetic biasing layer 116 with a magnetization 115 located at the edges of the free layer 110. Alternatively, the free layer 110 may be an antiparallel (AP) free layer, in which case the free layer magnetization 111 is the net magnetization of the AP-coupled bilayers which form the AP-free layer. In the absence of an applied field, the reference layer 120 has its magnetization direction 121 oriented generally orthogonal to the magnetization direction 111 of free layer 110 and pinned in that orientation by being exchange-coupled to an antiferromagnetic (AF) pinning layer 124. The materials used for free layer 110 and reference layer 120 may be crystalline CoFe or NiFe alloys, or a multilayer of these materials, such as a CoFe/NiFe bilayer. Alternatively, the free and reference layers comprise ferromagnetic materials with high spin polarization, such as Heusler alloys of the form $Co_2XY$, where X is one or more of Mn, Fe and Y is one or more of Si, Ge, Al. The AF layer 124 is typically one of the antiferromagnetic Mn alloys, e.g., PtMn, NiMn, FeMn, IrMn, PdMn, PtPdMn, RhMn, RuMn or RhRuMn, which are known to provide relatively high exchange-bias fields. Typically the Mn alloy material provides lower or little exchange-biasing in the as-deposited state, but when annealed provides stronger exchange-biasing of the ferromagnetic reference layer 120. A seed layer 125 may be located between the lower shield layer S1 and the AF layer 124 and enhances the growth of the antiferromagnetic layer 124. The seed layer 125 is typically one or more layers of NiFeCr, NiFe, CoFe, CoFeB, CoHf, Ta, Cu or Ru.

Figure 5:
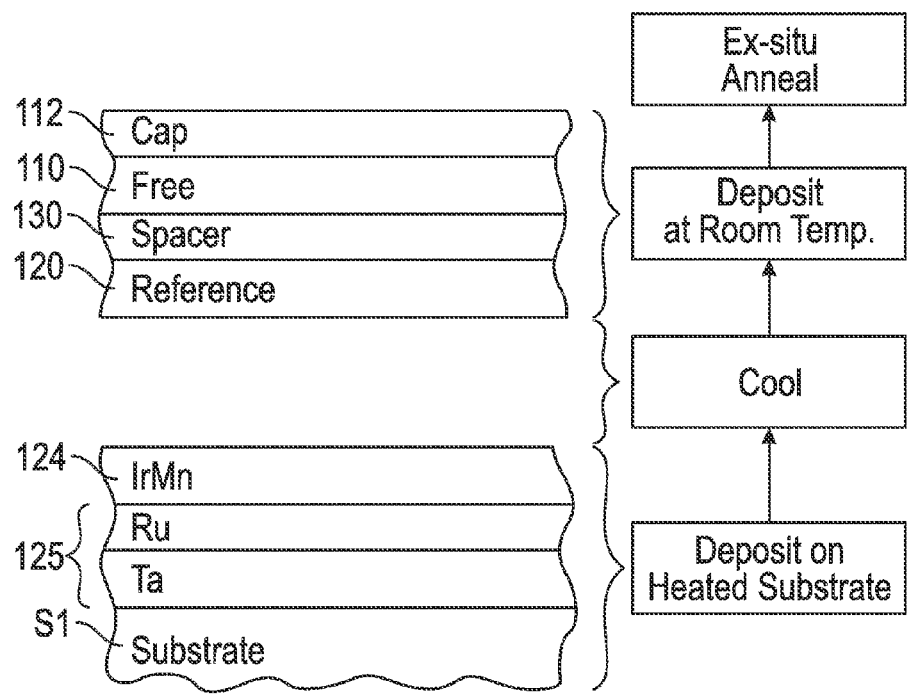
FIG. 5 illustrates the prior art method for forming the simple-pinned reference layer.

FIG. 5 illustrates the prior art method for forming the simple-pinned reference layer 120. Within the vacuum chamber the substrate (shield S1) is heated to between about 250-300° C. during the sequential deposition of the Ta/Ru bilayer seed layer 125 and IrMn alloy AF layer 124. The substrate with deposited layers is then cooled in the vacuum chamber, preferably to room temperature (i.e., below 50° C.), but to at least below 100° C. Then the ferromagnetic reference layer 120, nonmagnetic spacer layer 130, ferromagnetic free layer and capping layer 112 are sequentially deposited. This is typically followed by an ex-situ (outside the vacuum chamber) annealing in the presence of a magnetic field, followed by cooling to room temperature, to set the magnetization direction of the reference layer 120. This annealing step induces strong exchange-biasing of the ferromagnetic reference layer 120 in contact with the IrMn alloy AF layer 124.

Figure 6:
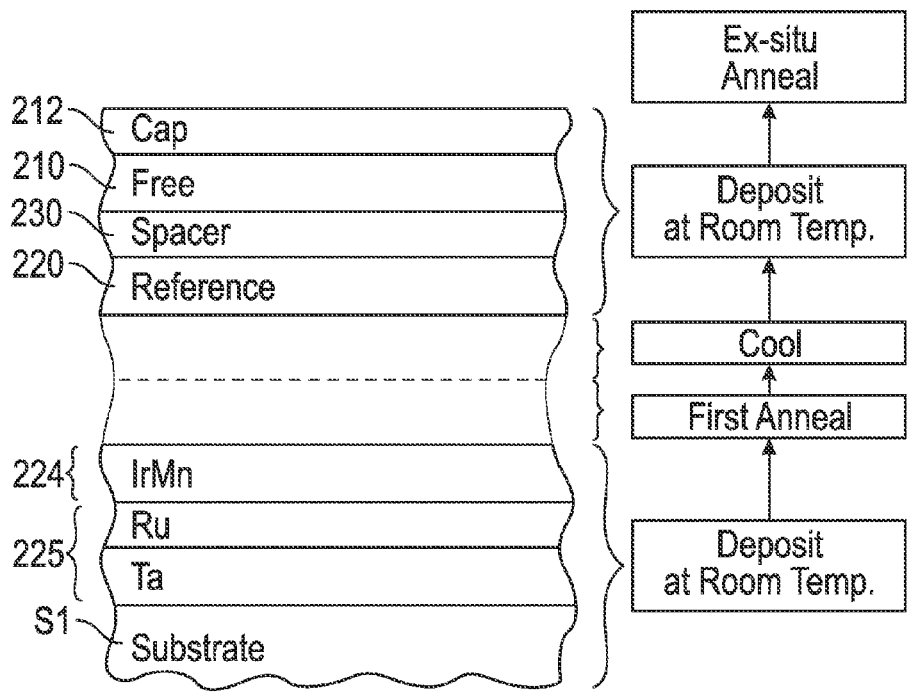
FIG. 6 illustrates the method of this invention for forming the simple-pinned reference layer.

FIG. 6 illustrates the method of this invention for forming the simple-pinned reference layer 220. Within the vacuum chamber the substrate (shield S1) is not heated but is at room temperature during the sequential deposition of the Ta/Ru bilayer seed layer 225 and IrMn alloy AF layer 224. The Ta layer may have a thickness between about 10-50 Å and the Ru layer may have a thickness between about 10-50 Å. The IrMn alloy preferably contains between 15 and 25 atomic percent Ir and has a typical thickness in the range of about 30-80 Å. Then the substrate with deposited layers is subjected to a first annealing within the vacuum chamber at a temperature between 200-600° C. for between 1 to 120 minutes. The first annealing may be performed in the same vacuum chamber but is preferably moved to an interconnected smaller second chamber without breaking vacuum. This allows for better control of the annealing temperature. The substrate with deposited layers is then cooled preferably to room temperature, but to at least below 100° C., in the vacuum chamber. This may be done by moving the substrate with deposited layers to a water-cooled stage interconnected with the other vacuum chambers. The cooling operation can be done either within the same chamber where the in-situ annealing takes place, or in another interconnected chamber. Heating and cooling in the same chamber allows the best control of vacuum conditions. Then the ferromagnetic reference layer 220, nonmagnetic spacer layer 230, ferromagnetic free layer 210 and capping layer 212 are sequentially deposited within the vacuum chamber at room temperature. The reference layer 220 may be a single ferromagnetic layer, such as a single layer of a CoFe alloy, or a multilayer of ferromagnetic layers including high spin-polarization ferromagnetic materials such as Heusler alloys, i.e., a (CoFe)X alloy where X is one or more of Ge and Ga, or a $Co_2MnX$ alloy or a $Co_2(MnFe)X$ alloy, where X is one or more of Ge, Si, Al, Sn, Ga. For example, reference layer 220 may be a trilayer of $Co/Co_2Fe/(CoFe)_{75\%}Ge_{25\%}$ or $Co/Co_2Fe/Co_2MnGe$ where the Co layer is the interface layer in contact with the IrMn alloy AF layer 224. This is followed by an ex-situ (outside the vacuum chamber) annealing in the presence of a magnetic field to set the magnetization direction of the reference layer 220. This second annealing step is done at a maximum temperature between about 200-400° C. for between about 0.5-50 hours, followed by cooling, preferably to room temperature, but to at least below 100° C., and induces strong exchange-biasing of the ferromagnetic reference layer 220 in contact with the IrMn alloy AF layer 224. Other in-situ anneal steps may be performed as needed for improving properties of various layers within the stack.

The strength of the exchange coupling between the reference layer and the AF layer is measured by the unidirectional anisotropy constant, $J_K$, according to the following:

$$J_K = M_s t H_{ex}, \quad \text{(Equation 1)}$$

where $M_s$ is the saturation magnetization of the reference layer, t is the thickness of the reference layer, and $H_{ex}$ is the exchange biasing field determined as a shift of the center of M-H loops along the field axis.

Figure 7:
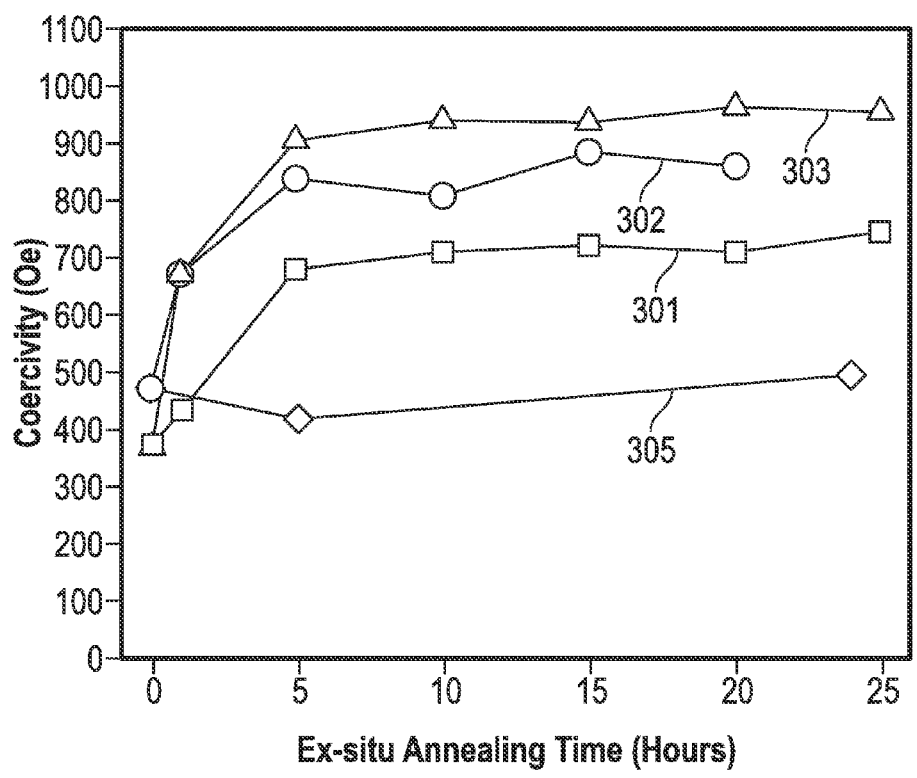
FIG. 7 is a graph comparing reference layer coercivity as a function of ex-situ anneal time for reference layers made according to the prior art and according to this invention.

The method of this invention results in $J_K$ values the same as result from the prior art method. However, the method of this invention results in substantially reduced values of coercivity for the reference layer. A low-coercivity reference layer is important so that only one orientation of the reference layer magnetization exists at the low magnetic fields where the sensor will operate, even if the value of $J_K$ is reduced from its maximum attainable value. FIG. 7 is a graph comparing reference layer coercivity as a function of ex-situ anneal time for reference layers made according to the prior art and according to this invention. The test samples for the data of FIG. 7 had the following structure:

30 Å Ta-20 Å Ru Seed/60 Å IrMn AF/30 Å $Co_{67}Fe_{33}$ Ref/30 Å Ag Spacer/No Free/70 Å Ru Cap Lines 301, 302 and 303 are for the prior art method (FIG. 5) where the substrate was heated to 245° C., 280° C. and 300° C., respectively, during the deposition of the seed and AF layers. Line 305 is for the method of this invention (FIG. 6) with room temperature deposition of the seed and AF layers followed by the first anneal at 400° C. for 15 minutes. As shown by FIG. 7, the method of this invention results in reference layers with coercivity values between about 450-500 Oe, as compared to coercivity values of between about 650-900 Oe for the method of the prior art.

A second set of measurements were made for test samples with the same structure as the test samples for FIG. 7, but wherein the ex-situ anneal time was for 48 hours. The reference layers made according to the method of this invention had substantially the same values of $J_K$ as the reference layers made according to the method of the prior art, but coercivity values of between 300-400 Oe as compared to 650-750 Oe for the method of the prior art.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method for making a current-perpendicular-to-the-plane (CPP) magnetoresistive sensor comprising:
    within a chamber having a vacuum,
        depositing on a substrate, without the application of heat to the substrate, a seed layer;
        depositing on the seed layer, without the application of heat to the substrate, a layer of a Mn alloy capable of becoming antiferromagnetic;
        thereafter heating the Mn alloy layer to a temperature greater than or equal to 200° C. and less than or equal to 600° C. for a period of time greater than or equal to 1 minute and less than or equal to 120 minutes;
        after cooling the Mn alloy layer, depositing on the Mn alloy layer a ferromagnetic reference layer;
    removing the substrate with deposited layers from the vacuum chamber; and
    in the presence of a magnetic field, subjecting the deposited layers to a temperature between 200-400° C. for between 0.5-50 hours.

2. The method of claim 1 wherein said Mn alloy consists essentially of a IrMn alloy.

3. The method of claim 1 wherein said seed layer comprises one or more layers selected from Ta, Ru, NiFeCr, NiFe, CoFe, CoFeB, CoHf and Cu.

4. The method of claim 3 wherein said seed layer comprises a Ta/Ru bilayer.

5. The method of claim 1 wherein the depositions of the seed layer and Mn alloy layer are performed in a first vacuum chamber and the heating of the Mn alloy layer is performed in a second vacuum chamber connected to said first vacuum chamber.

6. The method of claim 1 wherein the ferromagnetic reference layer consists of a single layer.

7. The method of claim 1 wherein the ferromagnetic reference layer comprises a multilayer of ferromagnetic layers.

8. The method of claim 7 wherein the multilayer includes a Co layer in contact with the Mn alloy layer.

9. The method of claim 7 wherein the multilayer comprises a $Co_2Fe$ layer and a layer selected from a (CoFe)X alloy layer where X is one or more of Ge and Ga, a Co$_2$MnX and a Co$_2$(MnFe)X alloy layer, where X is one or more of Ge, Si, Al, Sn and Ga.

10. A method for making a current-perpendicular-to-the-plane (CPP) magnetoresistive sensor having a simple-pinned ferromagnetic reference layer comprising:

providing a substrate in a vacuum chamber;

depositing on the substrate at room temperature a seed layer;

depositing on the seed layer at room temperature a IrMn alloy layer;

performing a first annealing by subjecting the deposited layers to a temperature between 200-600° C. for between 1-120 minutes;

cooling the deposited layers to a temperature below 100° C.;

depositing a ferromagnetic reference layer on the IrMn alloy layer;

depositing a nonmagnetic spacer layer on the ferromagnetic reference layer;

depositing a free ferromagnetic layer on the nonmagnetic spacer layer;

depositing a capping layer on the free layer;

removing the substrate with deposited layers from the vacuum chamber; and in the presence of a magnetic field, performing a second annealing by subjecting the deposited layers to a temperature between 200-400° C. for between 0.5-50 hours to thereby increase the exchange coupling between the IrMn alloy layer and the ferromagnetic reference layer.

11. The method of claim 10 wherein said seed layer comprises one or more layers selected from Ta, Ru, NiFeCr, NiFe, CoFe, CoFeB, CoHf and Cu.

12. The method of claim 11 wherein said seed layer comprises a Ta/Ru bilayer.

13. The method of claim 10 wherein the depositions of the seed layer and IrMn alloy layer are performed in a first vacuum chamber and the first annealing is performed in a second vacuum chamber connected to said first vacuum chamber.

14. The method of claim 10 wherein the ferromagnetic reference layer consists of a single layer.

15. The method of claim 10 wherein the ferromagnetic reference layer comprises a multilayer of ferromagnetic layers.

16. The method of claim 15 wherein the multilayer includes a Co layer in contact with the IrMn alloy layer.

17. The method of claim 15 wherein the multilayer comprises a Co$_2$Fe layer and a layer selected from a (CoFe)X alloy layer where X is one or more of Ge and Ga, a Co$_2$MnX and a Co$_2$(MnFe)X alloy layer, where X is one or more of Ge, Si, Al, Sn and Ga.

* * * * *